United States Patent
Takeda et al.

(10) Patent No.: US 11,295,959 B2
(45) Date of Patent: Apr. 5, 2022

(54) METHOD OF DETERMINING PLASMA ABNORMALITY, METHOD OF MANUFACTURING SEMICONDUCTOR DEVICE, AND SUBSTRATE PROCESSING APPARATUS

(71) Applicant: KOKUSAI ELECTRIC CORPORATION, Tokyo (JP)

(72) Inventors: Tsuyoshi Takeda, Toyama (JP); Tatsuya Nishino, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/785,229

(22) Filed: Feb. 7, 2020

(65) Prior Publication Data
US 2020/0176261 A1 Jun. 4, 2020

Related U.S. Application Data

(63) Continuation of application No. PCT/JP2018/027282, filed on Jul. 20, 2018.

(30) Foreign Application Priority Data

Aug. 14, 2017 (JP) .............................. JP2017-156471

(51) Int. Cl.
*H01L 21/3065* (2006.01)
*H01J 37/32* (2006.01)
(Continued)

(52) U.S. Cl.
CPC .......... *H01L 21/3065* (2013.01); *C23C 16/52* (2013.01); *H01J 37/32449* (2013.01);
(Continued)

(58) Field of Classification Search
None
See application file for complete search history.

(56) References Cited

U.S. PATENT DOCUMENTS

| 6,450,117 B1 | 9/2002 | Murugesh et al. | |
| 2010/0149326 A1* | 6/2010 | Shin .................. | H01J 37/32357 348/86 |

(Continued)

FOREIGN PATENT DOCUMENTS

| JP | 2001-319922 A | 11/2001 |
| JP | 2003-173973 A | 6/2003 |

(Continued)

OTHER PUBLICATIONS

Korean Office Action dated Mar. 2, 2020 for the Korean Patent Application No. 10-2020-7001045.
(Continued)

*Primary Examiner* — Jiong-Ping Lu
(74) *Attorney, Agent, or Firm* — Volpe Koenig

(57) ABSTRACT

There is provided a technique that includes: imaging a gas supply hole configured to supply a plasma-converted gas into a process chamber by using an imaging device disposed in the process chamber; detecting a plasma emission intensity based on an image of the imaged gas supply hole; and determining at least one of whether abnormal plasma discharge has occurred and whether plasma flickering has occurred based on the detected plasma emission intensity.

19 Claims, 12 Drawing Sheets

(51) Int. Cl.
- *H01L 21/02* (2006.01)
- *C23C 16/52* (2006.01)
- *H05H 1/00* (2006.01)
- *H05H 1/46* (2006.01)
- *H01L 21/31* (2006.01)

(52) U.S. Cl.
CPC .... *H01J 37/32935* (2013.01); *H01L 21/0217* (2013.01); *H01L 21/0228* (2013.01); *H01L 21/02211* (2013.01); *H01L 21/02274* (2013.01); *H01L 21/31* (2013.01); *H05H 1/00* (2013.01); *H05H 1/0025* (2013.01); *H05H 1/46* (2013.01); *H01J 2237/3151* (2013.01)

(56) References Cited

U.S. PATENT DOCUMENTS

| | | | |
|---|---|---|---|
| 2011/0090503 | A1 | 4/2011 | Lee et al. |
| 2016/0071695 | A1 | 3/2016 | Torregrosa et al. |

FOREIGN PATENT DOCUMENTS

| | | | | |
|---|---|---|---|---|
| JP | 2004-095985 | A | 3/2004 | |
| JP | 2005-251775 | A | 9/2005 | |
| JP | 2006-188729 | A | 7/2006 | |
| JP | 2009064610 | * | 3/2009 | ......... H01L 21/3065 |
| JP | 2010-527096 | A | 8/2010 | |
| JP | 2011-086601 | A | 4/2011 | |
| JP | 2011-114234 | A | 6/2011 | |
| JP | 2011-135010 | A | 7/2011 | |
| JP | 2014-143353 | A | 8/2014 | |
| JP | 2015-092637 | A | 5/2015 | |
| JP | 2016-58361 | A | 4/2016 | |
| JP | 2016-106415 | A | 6/2016 | |
| KR | 20020012520 | A | 2/2002 | |
| KR | 100860473 | B1 | 9/2008 | |
| KR | 10-1034275 | B1 | 5/2011 | |
| KR | 20150140311 | A | 12/2015 | |

OTHER PUBLICATIONS

Korean Office Action dated Mar. 2, 2020 for the Korean Patent Application No. 10-2020-7001046.
Korean Office Action dated Mar. 2, 2020 for the Korean Patent Application No. 10-2020-7001048.
Japanese Office Action dated Mar. 27, 2020 for the Japanese Patent Application No. 2019-536452.
Korean Office Action dated Sep. 14, 2020 for Korean Patent Application No. 10-2020-7023102.
International Search Report and English Translation, PCT/JP2018/027282 dated Oct. 16, 2018, 5 pgs.
Korean Office Action dated Jun. 16, 2020 for the Korean Patent Application No. 10-2019-7024957.
Japanese Office Action dated Apr. 6, 2021 for Japanese Patent Application No. 2020-089327.
Japanese Office Action dated Nov. 2, 2021 for Japanese Patent Application No. 2020-089327.

* cited by examiner

METHOD OF DETERMINING PLASMA ABNORMALITY, METHOD OF MANUFACTURING SEMICONDUCTOR DEVICE, AND SUBSTRATE PROCESSING APPARATUS

CROSS-REFERENCE TO RELATED APPLICATION

This application is a Bypass Continuation Application of PCT International Application No. PCT/JP2018/027282, filed on Jul. 20, 2018, the entire contents of which are incorporated herein by reference.

TECHNICAL FIELD

The present disclosure relates to a method of determining a plasma abnormality, a method of manufacturing a semiconductor device, and a substrate processing apparatus.

BACKGROUND

As a semiconductor device manufacturing process, a substrate processing process is often carried out in which a substrate is loaded into a process chamber of a substrate processing apparatus, a precursor gas, a reaction gas and so on supplied into the process chamber are activated by using plasma, and various films such as an insulating film, a semiconductor film, a conductor film and the like are formed on the substrate or removed from the substrate. In the related art, the plasma is used for promoting the reaction of a deposited thin film, removing impurities from the thin film, or assisting the chemical reaction of a film-forming precursor.

However, when a plasma electrode deteriorates due to aging or unexpected causes, abnormal discharge such as arc discharge, or plasma flickering may occur in a plasma generation part or an excited species supply port around the plasma generation part. However, since methods for dealing with these abnormal states are different, there is a case where it is necessary to strictly determine the abnormality that has occurred.

SUMMARY

Some embodiments of the present disclosure provide a technique capable of determining a plasma abnormality.

According to an embodiment of the present disclosure, there is provided a technique including:

imaging a gas supply hole configured to supply a plasma-converted gas into a process chamber by using an imaging device disposed in the process chamber;

detecting a plasma emission intensity based on an image of the imaged gas supply hole; and determining at least one of whether abnormal plasma discharge has occurred and whether plasma flickering has occurred based on the detected plasma emission intensity.

DETAILED DESCRIPTION

Embodiments of the Present Disclosure

A substrate processing apparatus according to one embodiment of the present disclosure will now be described with reference to FIGS. 1 to 9.

(1) Configuration of Substrate Processing Apparatus (Heating Device)

Figure 1:
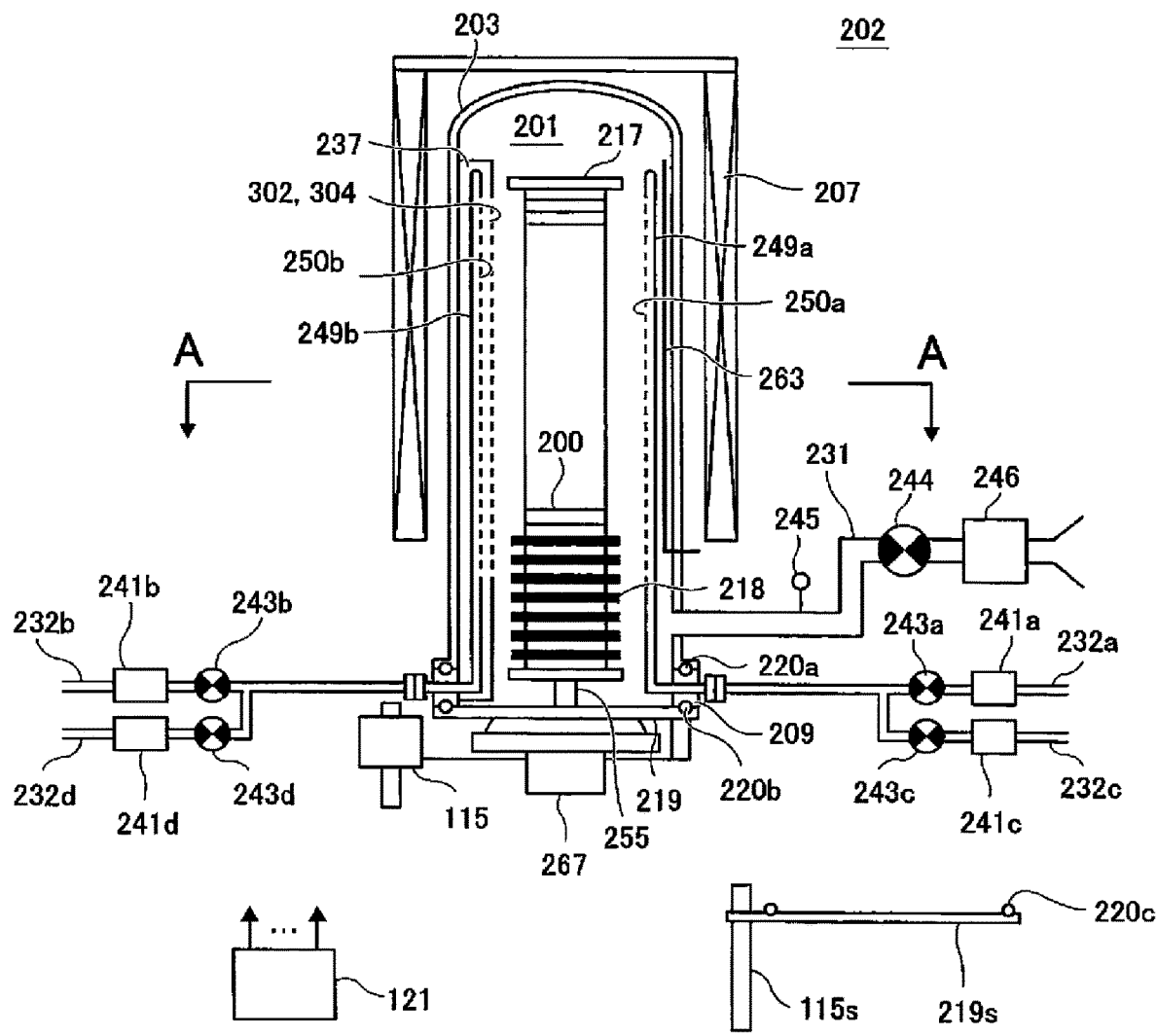
FIG. 1 is a schematic configuration view of a vertical process furnace of a substrate processing apparatus suitably used in an embodiment of the present disclosure, in which a portion of the process furnace is illustrated in a vertical cross-sectional view.

A substrate processing apparatus according to one embodiment of the present disclosure includes a process furnace 202, as illustrated in FIG. 1. The process furnace 202 is a so-called vertical furnace in which substrates can be accommodated in multiple stages in a vertical direction, and includes a heater 207 as a heating device (a heating mechanism). The heater 207 has a cylindrical shape and is supported by a heat base (not shown) serving as a support plate so as to be vertically installed. As will be described later, the heater 207 functions as an activation mechanism (an excitation part) configured to thermally activate (excite) a gas.

(Process Chamber)

A reaction tube 203 is disposed inside the heater 207 to be concentric with the heater 207. The reaction tube 203 is made of, for example, a heat resistant material such as quartz ($SiO_2$), silicon carbide (SiC) or the like, and has a cylindrical shape with its upper end closed and its lower end opened. A manifold (inlet flange) 209 is disposed under the reaction tube 203 so as to be concentric with the reaction tube 203. The manifold 209 is made of, for example, a metal material such as stainless steel (SUS) or the like, and has a cylindrical shape with both upper and lower ends thereof opened. The upper end portion of the manifold 209 engages with the lower end portion of the reaction tube 203 so as to support the reaction tube 203. An O-ring 220a serving as a seal member is installed between the manifold 209 and the reaction tube 203. As the manifold 209 is supported by the heater base, the reaction tube 203 comes into a vertically installed state. A process vessel (reaction vessel) mainly includes the reaction tube 203 and the manifold 209. A process chamber 201 is formed in a hollow cylindrical portion of the process vessel. The process chamber 201 is configured to be able to accommodate a plurality of wafers 200 as substrates. The process vessel is not limited to the above configuration, and only the reaction tube 203 may be referred to as the process vessel.

Nozzles 249a and 249b are installed in the process chamber 201 so as to penetrate a sidewall of the manifold 209. Gas supply pipes 232a and 232b are connected to the nozzles 249a and 249b, respectively. In this manner, the two nozzles 249a and 249b and the two gas supply pipes 232a and 232b are installed in the reaction tube 203, thereby allowing plural kinds of gases to be supplied into the process chamber 201. When the manifold 209 is not installed and only the reaction tube 203 is used as the process vessel, the nozzles 249a and 249b may be installed so as to penetrate the sidewall of the reaction tube 203.

Mass flow controllers (MFCs) 241a and 241b, which are flow rate controllers (flow rate control parts), and valves 243a and 243b, which are opening/closing valves, are installed in the gas supply pipes 232a and 232b sequentially from upstream sides of gas flow, respectively. Gas supply pipes 232c and 232d for supplying an inert gas are connected to the gas supply pipes 232a and 232b at downstream sides of the valves 243a and 243b, respectively. MFCs 241c and 241d and valves 243c and 243d are respectively installed in the gas supply pipes 232c and 232d sequentially from upstream sides of gas flow.

Figure 2:
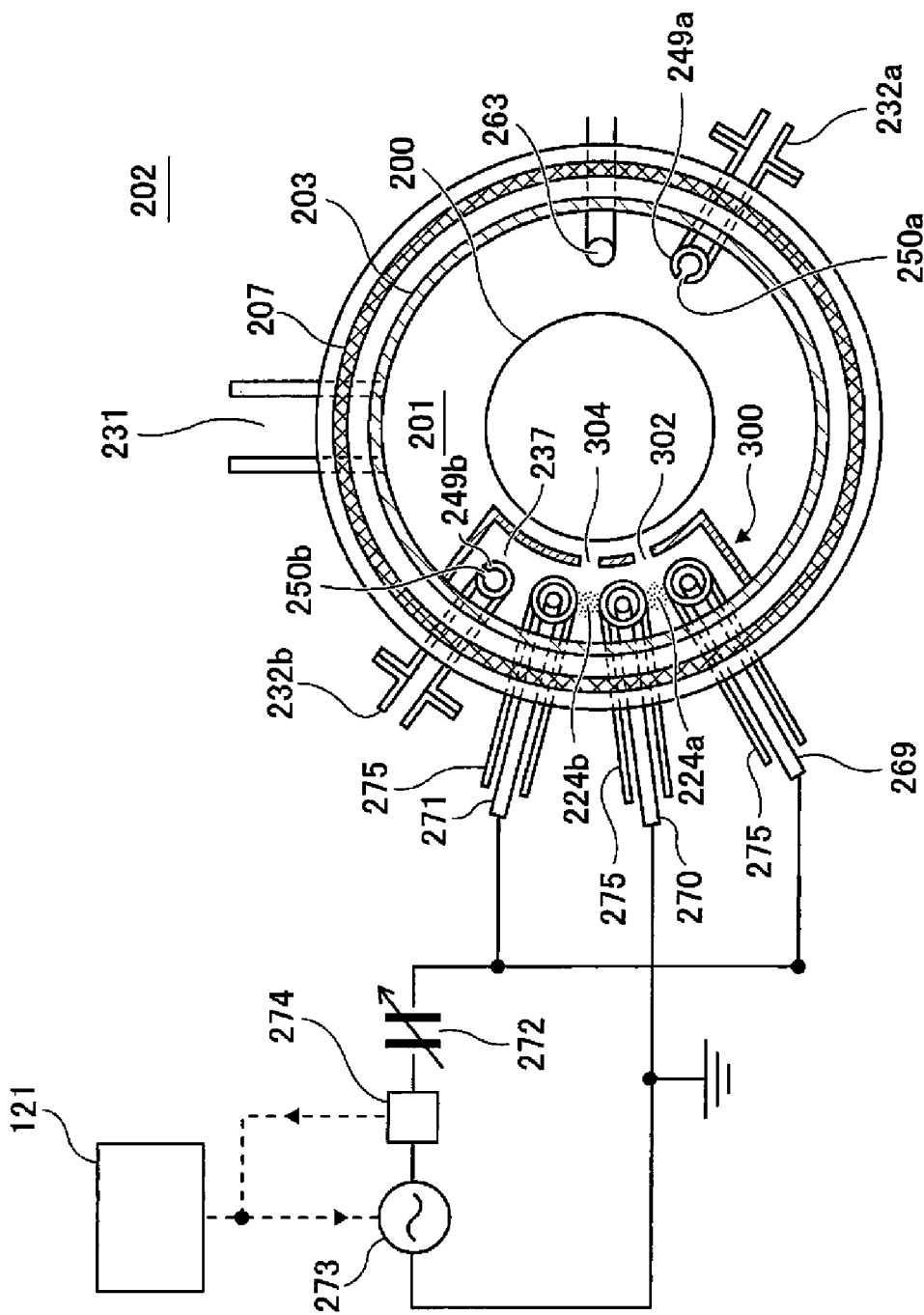
FIG. 2 is a schematic configuration view of the vertical process furnace of the substrate processing apparatus suitably used in an embodiment of the present disclosure, in which a portion of the process furnace is illustrated in a cross-sectional view taken along the line A-A in FIG. 1.

As illustrated in FIG. 2, the nozzle 249a is installed in a space between an inner wall of the reaction tube 203 and the wafers 200 so as to extend upward along a stacking direction of the wafers 200 from a lower portion to an upper portion of the inner wall of the reaction tube 203. Specifically, the nozzle 249a is installed at a lateral side of the wafer arrangement region (mounting region) in which the wafers 200 are arranged (mounted), namely in a region which horizontally surrounds the wafer arrangement region, so as to extend along the wafer arrangement region. That is, the nozzle 249a is installed in a perpendicular relationship with the surfaces (flat surfaces) of the wafers 200 at a lateral side of the end portions (peripheral edge portions) of the wafers 200, which are loaded into the process chamber 201.

Gas supply holes 250a for supplying a gas is formed on the side surface of the nozzle 249a. The gas supply holes 250a are opened toward the center of the reaction tube 203 so as to allow a gas to be supplied toward the wafers 200. The gas supply holes 250a may be formed in a plural number between a lower portion and an upper portion of the reaction tube 203. The respective gas supply holes 250a may be formed to have the same aperture area and may be formed at the same aperture pitch.

The nozzle 249b is installed within a buffer chamber 237 serving as a gas dispersion space. As illustrated in FIG. 2, the buffer chamber 237 is disposed in an annular space (in a plane view) between the inner wall of the reaction tube 203 and the wafers 200 such that the buffer chamber 237 extends upward along the stack direction of the wafers 200 from the lower portion to the upper portion of the inner wall of the reaction tube 203. Specifically, the buffer chamber 237 is formed by a buffer structure 300 along the wafer arrangement region in a region horizontally surrounding the wafer arrangement region at the lateral side of the wafer arrangement region. The buffer structure 300 is made of an insulating material such as quartz. Gas supply holes 302 and 304 for supplying a gas or active species to be described later into the process chamber 201 are formed on an arc-shaped wall surface of the buffer structure 300.

As illustrated in FIG. 2, the gas supply holes 302 and 304 are opened toward the center of the reaction tube 203 at positions facing plasma generation regions 224a and 224b between rod-shaped electrodes 269 and 270 (which will be described later) and between rod-shaped electrodes 270 and 271 (which will be described later) respectively, thereby allowing a gas or active species (which will be described later) to be supplied toward the wafers 200. A plurality of gas supply holes 302 and 304 may be formed between the lower portion and the upper portion of the reaction tube 203. The plurality of gas supply holes 302 and 304 may be formed to have the same aperture area at the same aperture pitch.

The nozzle 249b is disposed so as to extend upward along the stack direction of the wafers 200 from the lower portion to the upper portion of the inner wall of the reaction tube 203. Specifically, the nozzle 249b is installed in a region horizontally surrounding the wafer arrangement region in which the wafers 200 are arranged at the lateral side of the wafer arrangement region inside the buffer structure 300, along the wafer arrangement region. That is, the nozzle 249b is installed in a perpendicular relationship with the surfaces of the wafers 200 at the lateral side of the end portions of the wafers 200, which are loaded into the process chamber 201.

A gas supply hole 250b for supplying a gas is formed on the side surface of the nozzle 249b. The gas supply hole 250b is opened toward a wall surface formed in the radial direction with respect to the arc-shaped wall surface of the buffer structure 300, thereby allowing a gas to be supplied toward the wall surface. As a result, the reaction gas is dispersed in the buffer chamber 237 and is not directly blown to the rod-shaped electrodes 269 to 271, thereby suppressing generation of particles. As with the gas supply hole 250a, a plurality of gas supply holes 250b may be formed between the lower portion and the upper portion of the reaction tube 203.

A precursor containing a predetermined element, for example, a silane precursor gas containing silicon (Si) as the predetermined element, is supplied from the gas supply pipe 232a into the process chamber 201 via the MFC 241a, the valve 243a and the nozzle 249a.

An example of the silane precursor gas may include a precursor gas containing Si and a halogen element, that is, a halosilane precursor gas. The halosilane precursor is a silane precursor having a halogen group. The halogen element includes at least one selected from the group including chlorine (Cl), fluorine (F), bromine (Br) and iodine (I).

An example of the halosilane precursor gas may include a precursor gas containing Si and Cl, that is, a chlorosilane precursor gas. An example of the chlorosilane precursor gas may include a dichlorosilane ($SiH_2Cl_2$, abbreviation: DCS) gas.

A reactant containing an element different from the above-mentioned predetermined element, for example, a nitrogen (N)-containing gas as a reaction gas, is supplied from the gas supply pipe 232b into the process chamber 201 via the MFC 241b, the valve 243b and the nozzle 249b. An example of the N-containing gas may include a hydrogen nitride-based gas. The hydrogen nitride-based gas is a substance including only two elements of N and H, and acts as a nitriding gas, that is, an N source. An example of the hydrogen nitride-based gas may include an ammonia ($NH_3$) gas.

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b and the nozzles 249a and 249b, respectively.

A precursor supply system as a first supply system mainly includes the gas supply pipe 232a, the MFC 241a and the valve 243a. A reactant supply system as a second supply system mainly includes the gas supply pipe 232b, the MFC 241b and the valve 243b. An inert gas supply system mainly includes the gas supply pipes 232c and 232d, the MFCs 241c and 241d and the valves 243c and 243d. The precursor supply system, the reactant supply system and the inert gas supply system are collectively referred to simply as a gas supply system (gas supply part).

(Plasma Generation Part)

As illustrated in FIG. 2, three rod-shaped electrodes 269, 270 and 271, which are made of a conductor and have an elongated structure, are disposed in the buffer chamber 237 along the arrangement direction of the wafers 200 to span from the lower portion to the upper portion of the reaction tube 203. Each of the rod-shaped electrodes 269, 270 and 271 is installed parallel to the nozzle 249b. Each of the rod-shaped electrodes 269, 270 and 271 is covered with and protected by an electrode protection tube 275 over a region spanning from an upper portion to a lower portion thereof. Of the rod-shaped electrodes 269, 270 and 271, the rod-shaped electrodes 269 and 271 disposed at both ends are connected to a high frequency power supply 273 via a matching device 272 and an impedance measuring device 274. The rod-shaped electrode 270 is grounded to the ground that is the reference potential. That is, the rod-shaped electrodes connected to the high frequency power supply 273 and the grounded rod-shaped electrode are alternately arranged. The rod-shaped electrode 270 interposed between the rod-shaped electrodes 269 and 271 connected to the high frequency power supply 273 is used in common for the rod-shaped electrodes 269 and 271 as the grounded rod-shaped electrodes. In other words, the grounded rod-shaped electrode 270 is disposed so as to be sandwiched between the rod-shaped electrodes 269 and 271 connected to the adjacent high frequency power supply 273, and the rod-shaped electrode 269 and the rod-shaped electrode 270, and, similarly, the rod-shaped electrode 271 and the rod-shaped electrode 270 are respectively configured to be paired to generate plasma. That is, the grounded rod-shaped electrode 270 is used in common for the rod-shaped electrodes 269 and 271 connected to two high frequency power supplies 273 adjacent to the rod-shaped electrode 270. By applying high frequency (RF) power from the high frequency power supply 273 to between the rod-shaped electrodes 269 and 271, plasma is generated in a plasma generation region 224a between the rod-shaped electrodes 269 and 270 and in a plasma generation region 224b between the rod-shaped electrodes 270 and 271.

The impedance measuring device 274 is installed between the matching device 272 and the high frequency power supply 273. The impedance measuring device 274 measures high frequency traveling and reflected waves, and the matching device 272 measures the load impedance and high frequency reflection state of the rod-shaped electrodes 269 and 271. That is, the impedance measuring device 274 measures the high frequency traveling and reflected waves, feeds back the measured values to a controller 121, and the controller 121 controls the high frequency power supply 273 so that the amount of plasma generated in the plasma generation regions 224a and 224b is controlled.

The information measured by the impedance measuring device 274 includes at least one of a voltage ratio or a power ratio of the high frequency reflected wave to the high frequency traveling wave, a difference in phase of the high frequency reflected wave with respect to the high frequency traveling wave, or resistance, reactance, conductance, susceptance, impedance, admittance and the like calculated from the voltage ratio or power ratio and the phase difference. Here, switches (not shown) may be interposed between the rod-shaped electrode 269 and the impedance measuring device 274 and between the rod-shaped electrode 271 and the impedance measuring device 274. Thus, by providing a switch between the rod-shaped electrode 269 and the impedance measuring device 274 and by providing a switch between the rod-shaped electrode 271 and the impedance measuring device 274, it is possible to specify one of the rod-shaped electrodes 269 and 270, which causes an abnormality such as deterioration, disconnection or short circuit.

A plasma generation part mainly includes the rod-shaped electrodes 269, 270 and 271 and the matching device 272 and generates plasma in the plasma generation regions 224a and 224b. The plasma generation part may include the electrode protection tubes 275, the high frequency power supply 273 and the impedance measuring device 274. As will be described later, the plasma generation part functions as a plasma excitation part (an activation mechanism) that plasma-excites a gas, namely, excites (activates) the gas into a plasma state.

Each electrode protection tube 275 has a structure in which each of the rod-shaped electrodes 269, 270 and 271 can be inserted into the buffer chamber 237 while keeping each of the rod-shaped electrodes 269, 270 and 271 isolated from the internal atmosphere of the buffer chamber 237. When an $O_2$ concentration within the electrode protection tube 275 is substantially equal to an $O_2$ concentration in the ambient air (atmosphere), the rod-shaped electrodes 269, 270 and 271 respectively inserted into the electrode protection tube 275 may be oxidized by the heat generated from the heater 207. By charging the interior of the electrode protection tube 275 with an inert gas such as a $N_2$ gas or the like, or by purging the interior of the electrode protection tube 275 with an inert gas such as a $N_2$ gas or the like through the use of an inert gas purge mechanism, it is possible to reduce the $O_2$ concentration within the electrode protection tube 275, thereby preventing oxidation of the rod-shaped electrodes 269, 270 and 271.

(Exhaust Part)

An exhaust pipe 231 for exhausting an internal atmosphere of the process chamber 201 is installed in the reaction tube 203. A vacuum pump 246, as a vacuum-exhausting device, is connected to the exhaust pipe 231 via a pressure sensor 245, which is a pressure detector (pressure detecting part) for detecting an internal pressure of the process chamber 201, and an auto pressure controller (APC) valve 244, which is an exhaust valve (pressure adjustment part). The APC valve 244 is configured to perform or stop a vacuum-exhausting operation in the process chamber 201 by opening or closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhausting system mainly includes the exhaust pipe 231, the APC valve 244 and the pressure sensor 245. The exhausting system may include the vacuum pump 246. The exhaust pipe 231 is not limited to being installed in the reaction pipe 203, but may be installed in the manifold 209 in the same manner as the nozzles 249a and 249b.

A seal cap 219, which serves as a furnace opening cover configured to hermetically seal a lower end opening of the manifold 209, is installed under the manifold 209. The seal cap 219 is configured to contact the lower end of the manifold 209 from the lower side in the vertical direction. The seal cap 219 is made of, for example, a metal material such as stainless steel (SUS) or the like, and is formed in a disc shape. An O-ring 220b, which is a seal member making contact with the lower end of the manifold 209, is installed on an upper surface of the seal cap 219. A rotation mechanism 267 configured to rotate a boat 217, which will be described later, is installed at the opposite side of the seal cap 219 from the process chamber 201. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism vertically installed outside the reaction tube 203. The boat elevator 115 is configured so as to load/unload the boat 217 into/out of the process chamber 201 by moving the seal cap 219 up or down. The boat elevator 115 is configured as a transfer device (transfer mechanism) which transfers the boat 217, that is, the wafers 200, into/out of the process chamber 201. In addition, a shutter 219s, which serves as a furnace opening cover configured to hermetically seal a lower end opening of the manifold 209 while the seal cap 219 is descended by the boat elevator 115, is installed under the manifold 209. The shutter 219s is made of, for example, a metal material such as stainless steel (SUS) or the like, and is formed in a disc shape. An O-ring 220c, which is a seal member making contact with the lower end of the manifold 209, is installed on an upper surface of the shutter 219s. The opening/closing operation (such as elevation operation, rotation operation or the like) of the shutter 219s is controlled by a shutter opening/closing mechanism 115s.

(Substrate Support)

As illustrated in FIG. 1, the boat 217 serving as a substrate support is configured to support one or more wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other at predetermined intervals. The boat 217 is made of a heat resistant material such as quartz or SiC. A heat insulating region where heat insulating plates 218 made of a heat resistant material such as quartz or SiC are supported in multiple stages is formed below the boat 217.

As illustrated in FIG. 2, a temperature sensor 263 serving as a temperature detector is installed in the reaction tube 203. Based on temperature information detected by the temperature sensor 263, a state of supplying electric power to the heater 207 is adjusted such that an interior of the process chamber 201 has a desired temperature distribution. The temperature sensor 263 is installed along the inner wall of the reaction tube 203 in the same manner as the nozzles 249a and 249b.

(Control Device)

Figure 3:
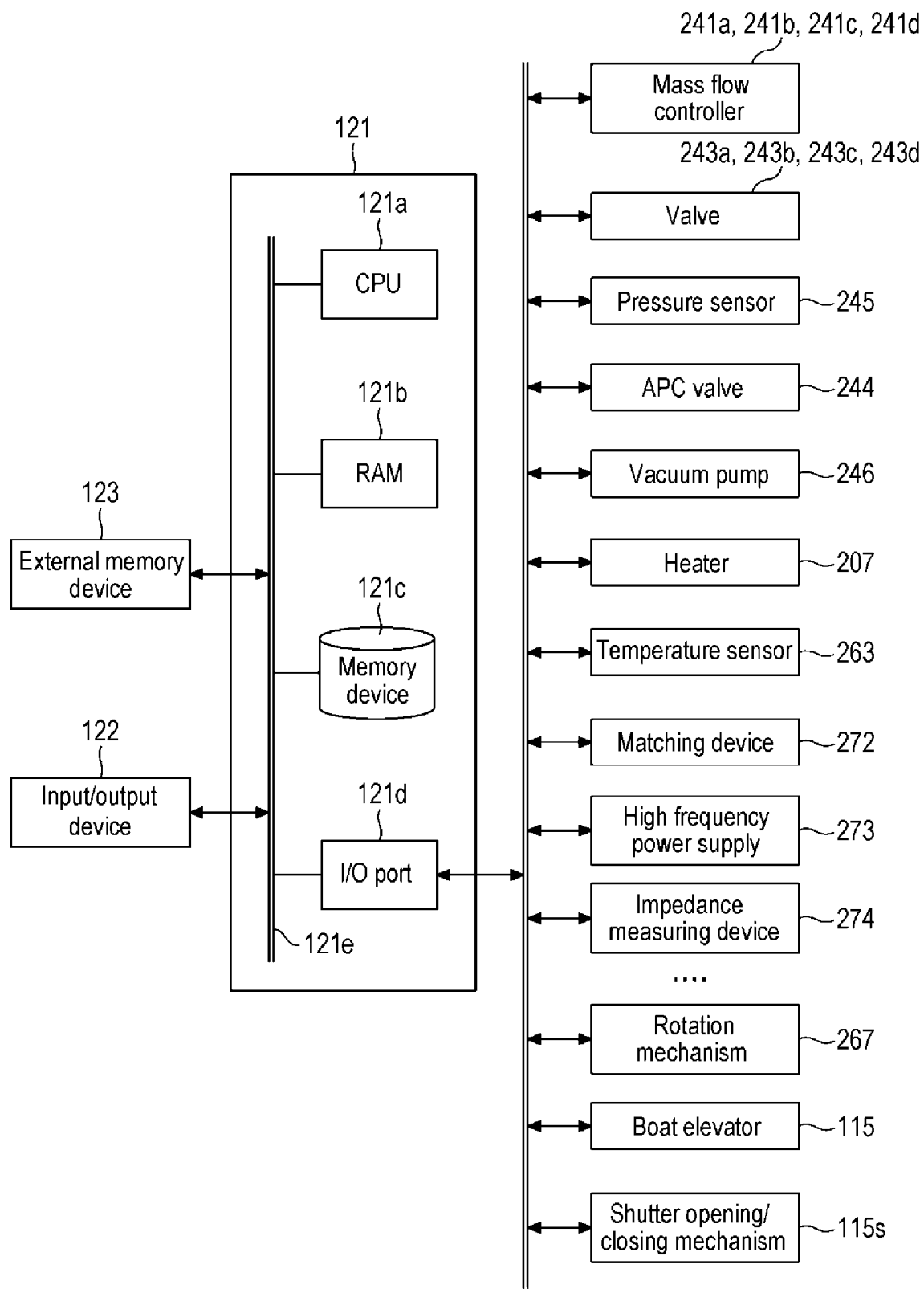
FIG. 3 is a schematic configuration diagram of a controller of the substrate processing apparatus suitably used in an embodiment of the present disclosure, in which a control system of a controller is illustrated in a block diagram.

Next, a control device will be described with reference to FIG. 3. As illustrated in FIG. 3, a controller 121, which is a control part (control device), is configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 configured as, e.g., a touch panel or the like, is connected to the controller 121.

The memory device 121c is configured by, for example, a flash memory, a hard disk drive (HDD) or the like. A control program for controlling operations of a substrate processing apparatus and a process recipe, in which sequences and conditions of a film-forming process to be described later are written, are readably stored in the memory device 121c. The process recipe functions as a program for causing the controller 121 to execute each sequence in the various processes (film-forming processes), which will be described later, to obtain an expected result. Hereinafter, the process recipe and the control program may be generally and simply referred to as a "program." Furthermore, the process recipe may be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the matching device 272, the high frequency power supply 273, the impedance measuring device 274, the rotation mechanism 267, the boat elevator 115, the shutter opening/closing mechanism 115s and the like.

The CPU 121a is configured to read and execute the control program from the memory device 121c. The CPU 121a also reads the recipe from the memory device 121c according to an input of an operation command from the input/output device 122. In addition, the CPU 121a is configured to control the rotation mechanism 267, the flow rate adjustment operation of various kinds of gases by the MFCs 241a to 241d, the opening/closing operation of the valves 243a to 243d, the adjustment operation of the high frequency power supply 273 based on impedance monitoring by the impedance measuring device 274, the opening/closing operation of the APC valve 244, the pressure adjusting operation performed by the APC valve 244 based on the pressure sensor 245, the actuating and stopping of the vacuum pump 246, the temperature adjustment operation performed by the heater 207 based on the temperature sensor 263, the forward/backward rotation, rotation angle and rotation speed adjustment operation of the boat 217 by the rotation mechanism 267, the operation of moving the boat 217 up or down by the boat elevator 115, and the like, according to contents of the read recipe.

The controller 121 may be configured by installing, on the computer, the aforementioned program stored in an external memory device (for example, a magnetic disk such as an HDD, an optical disc such as a CD, a magneto-optical disc such as an MO, or a semiconductor memory such as a USB memory) 123. The memory device 121c or the external memory device 123 is configured as a computer-readable recording medium. Hereinafter, the memory device 121c and/or the external memory device 123 may be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be provided to the computer using communication means such as the Internet or a dedicated line, instead of using the external memory device 123.

(2) Substrate Processing Process

Figure 4:
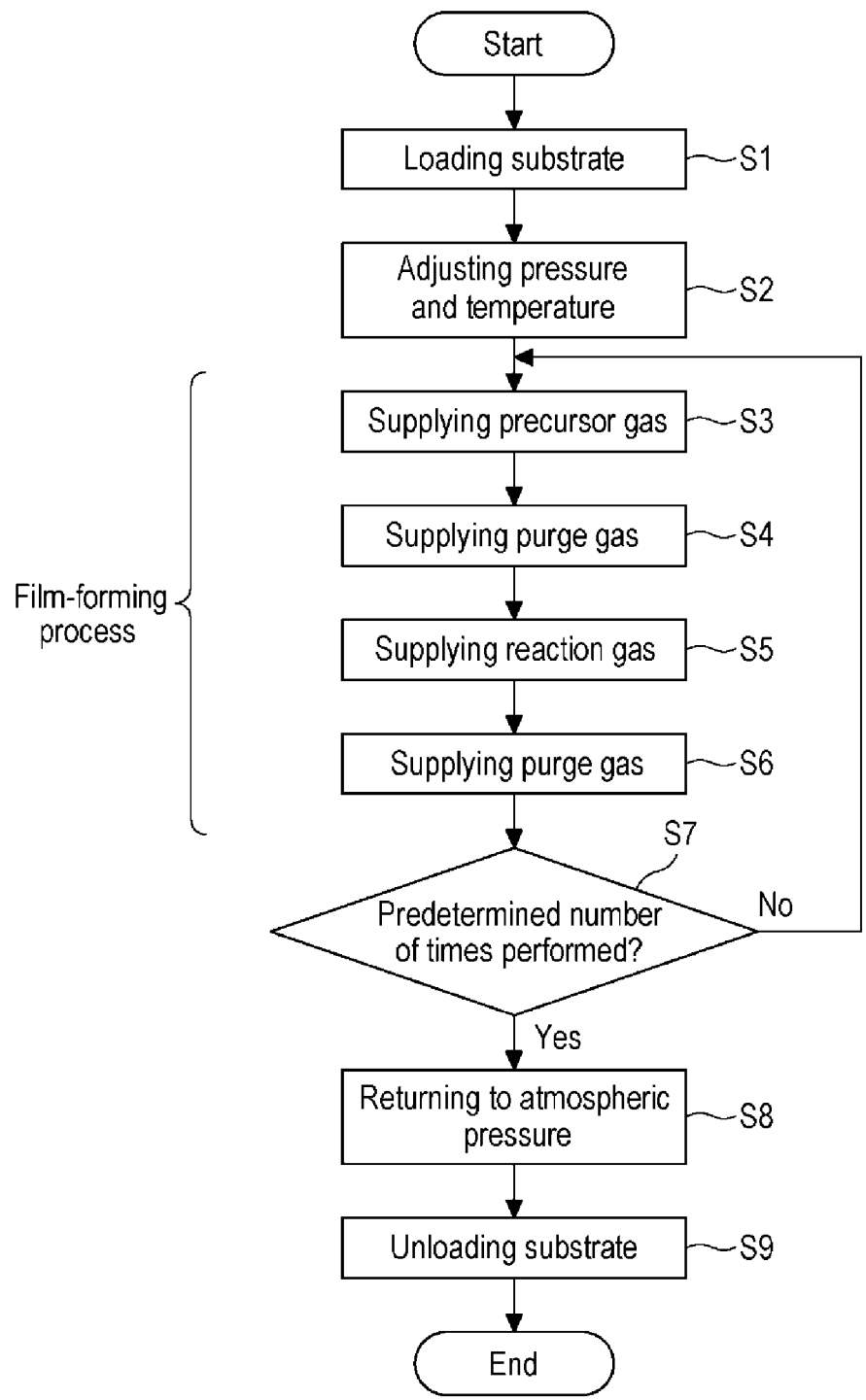
FIG. 4 is a flowchart of a substrate processing process according to an embodiment of the present disclosure.
Figure 5:
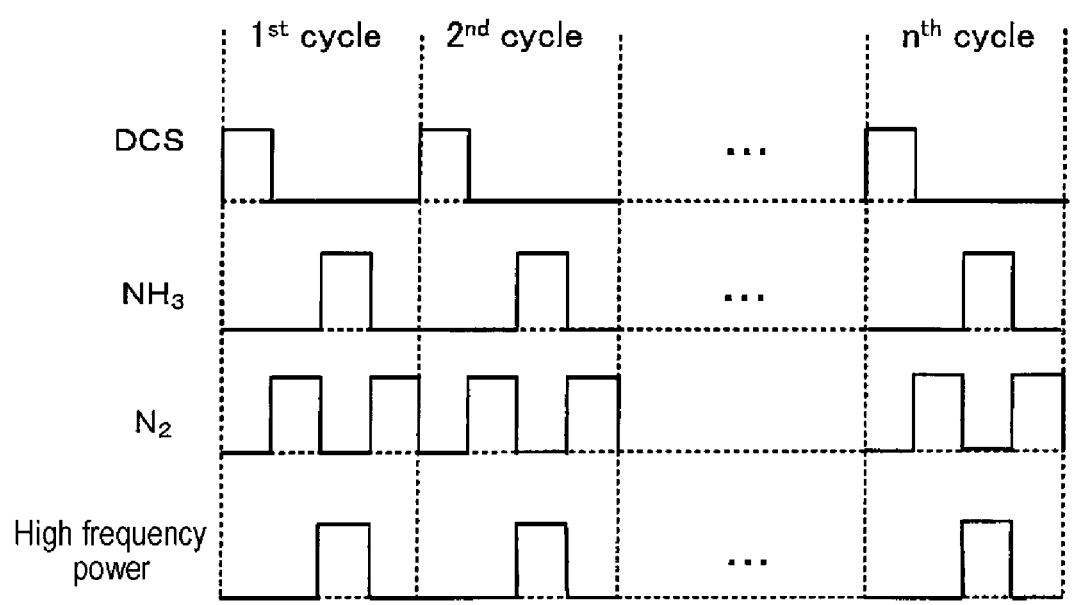
FIG. 5 is a diagram showing gas supply timings in the substrate processing process according to the embodiment of the present disclosure.

Next, a film-forming process of forming a thin film on a wafer 200, which is a substrate processing method using the substrate processing apparatus of the present embodiment, as one of processes for manufacturing a semiconductor device, will be described with reference to FIGS. 4 and 5. In the following descriptions, the operations of the respective parts constituting the substrate processing apparatus are controlled by the controller 121.

Here, examples will be described in which a silicon nitride film (SiN film) is formed, as a film containing Si and N, on a wafer 200 by, non-synchronously, that is, without being synchronized, a predetermined number of times (once or more), performing a step of supplying a DCS gas as a precursor gas and a step of supplying a plasma-excited $NH_3$ gas as a reaction gas. Further, for example, a predetermined film may be formed in advance on the wafer 200. Further, a predetermined pattern may also be formed in advance on the wafer 200 or the predetermined film.

In the present disclosure, for the sake of convenience, a process flow of a film-forming process flow illustrated in FIG. 5 may be denoted as follows. The same denotation may be used in other embodiments to be described below.

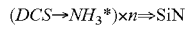

$(DCS \to NH_3^*) \times n \Rightarrow SiN$

When the term "wafer" is used herein, it may refer to "a wafer itself" or "a laminated body of a wafer and a predetermined layer or film formed on the surface of the wafer". In addition, when the phrase "a surface of a wafer" is used herein, it may refer to a surface of a wafer itself or a surface of a predetermined layer or the like formed on a wafer. In the present disclosure, the expression "a predetermined layer is formed on a wafer" may mean that a predetermined layer is directly formed on a surface of a wafer itself or that a predetermined layer is formed on a layer or the like formed on a wafer. In the present disclosure, when the term "substrate" is used herein, it may be synonymous with the term "wafer."

(Loading Step: S1)

If a plurality of wafers 200 is charged on the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure and Temperature Adjusting Step: S2)

The interior of the process chamber 201, namely the space in which the wafers 200 are located, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the rotation of the boat 217 and the wafers 200 by the rotation mechanism 267 begins. The exhaust of the interior of the process chamber 201 and the heating and rotation of the wafers 200 may be all continuously performed at least until the processing of the wafers 200 is completed.

(Film-Forming Step: S3, S4, S5 and S6)

Thereafter, a film-forming step is performed by sequentially performing steps S3, S4, S5 and S6.

(Precursor Gas Supplying Step: S3 and S4)

At step S3, a DCS gas is supplied to the wafer 200 in the process chamber 201.

The valve 243a is opened to allow the DCS gas to flow through the gas supply pipe 232a. A flow rate of the DCS gas is adjusted by the MFC 241a, and then the DCS gas is supplied from the gas supply hole 250a into the process chamber 201 via the nozzle 249a and is exhausted through the exhaust pipe 231. Simultaneously, the valve 243c may be opened to allow a $N_2$ gas to flow through the gas supply pipe 232c. A flow rate of the $N_2$ gas is adjusted by the MFC 241c, and the $N_2$ gas is supplied into the process chamber 201 together with the DCS gas and is exhausted through the exhaust pipe 231.

In addition, in order to prevent the DCS gas from entering into the nozzle 249b, the valves 243d may be opened to allow the $N_2$ gas to flow through the gas supply pipe 232d. The $N_2$ gas is supplied into the process chamber 201 through the gas supply pipe 232b and the nozzle 249b and is exhausted through the exhaust pipe 231.

A supply flow rate of the DCS gas, which is controlled by the MFC 241a, is set to fall within a range of, e.g., 1 to 6,000 sccm, or 2,000 to 3,000 sccm in some embodiments. Each of supply flow rates of the $N_2$ gas, which are controlled by the MFCs 241c and 241d, are set to fall within a range of, e.g., 100 to 10,000 sccm. An internal pressure of the process chamber 201 is set to fall within a range of, e.g., 1 to 2,666 Pa, or 665 to 1,333 Pa in some embodiments. A supply time of the DCS gas is set to fall within a range of, e.g., 1 to 10 seconds, or 1 to 3 seconds in some embodiments.

The temperature of the heater 207 is set such that the temperature of the wafer 200 becomes a temperature which falls within a range of, for example, 0 to 700 degrees C., a room temperature (25 degrees C.) to 550 degrees C. in some embodiments, or 40 to 500 degrees C. in some embodiments. By setting the temperature of the wafer 200 to 700 degrees C. or lower, further to 550 degrees C. or lower, and furthermore to 500 degrees C. or lower as in the present embodiments, it is possible to reduce the quantity of heat applied to the wafer 200, and to control the thermal history received by the wafer 200.

By supplying the DCS gas to the wafer 200 under the aforementioned conditions, a Si-containing layer containing Cl is formed on the wafer 200 (a base film on its surface). The Si-containing layer containing Cl may be a Si layer containing Cl or an adsorption layer of DCS, or may include both of them. Hereinafter, the Si-containing layer containing Cl will be simply referred to as a Si-containing layer.

After the Si-containing layer is formed, the valve 243a is closed to stop the supply of the DCS gas into the process chamber 201. In this operation, the interior of the process chamber 201 is vacuum-exhausted by the vacuum pump 246 while maintaining the APC valve 244 opened. Thus, the DCS gas which has not reacted, the DCS gas which has contributed to the formation of the Si-containing layer, or reaction byproduct, or the like, which remains within the process chamber 201, is removed from the interior of the process chamber 201 (S4). Furthermore, the supply of the $N_2$ gas into the process chamber 201 is maintained while maintaining the valves 243c and 243d opened. The $N_2$ gas acts as a purge gas. This S4 may also be omitted.

As the precursor gas, it may be possible to suitably use various kinds of aminosilane precursor gases such as tetrakis-dimethylaminosilane gas, tris-dimethylaminosilane gas, bis-dimethylaminosilane gas, bis-diethylaminosilane gas, bis-tertiary-butylaminosilane gas, dimethylaminosilane gas, diethylaminosilane gas, dipropylaminosilane gas, diisopropylaminosilane gas, butylaminosilane gas, hexamethyldisilazane gas, or the like, an inorganic halosilane precursor gases such as monochlorosilane gas, trichlorosilane gas, tetrachlorosilane gas, hexachlorodisilane gas, octachlorotrisilane gas, or the like, or a halogen group-free inorganic silane precursor gas such as monosilane gas, disilane gas, trisilane gas, or the like, as well as the DCS gas.

As the inert gas, it may be possible to use a rare gas such as Ar gas, He gas, Ne gas, Xe gas, or the like, as well as the $N_2$ gas.

(Reaction Gas Supply Step: S5 and S6)

After the film-forming process is completed, plasma-excited $NH_3$ gas as a reaction gas is supplied to the wafer 200 in the process chamber 201 (S5).

In this step, the opening/closing control of the valves 243b to 243d is performed in the same procedure as the opening/closing control of the valves 243a, 243c and 243d in step S3. A flow rate of the $NH_3$ gas is adjusted by the MFC 241b, and the $NH_3$ gas is then supplied into the buffer chamber 237 through the nozzle 249b. At this time, high frequency power is supplied between the rod-shaped electrodes 269, 270 and 271. The $NH_3$ gas supplied into the buffer chamber 237 is plasma-excited (plasma-converted and activated), supplied as active species ($NH_3^*$) into the process chamber 201, and exhausted through the exhaust pipe 231.

The supply flow rate of the $NH_3$ gas controlled by the MFC 241b is set at a flow rate which falls within a range of, for example, 100 to 10,000 sccm or 1,000 to 2,000 sccm in some embodiments. The high frequency power applied to the rod-shaped electrodes 269, 270, and 271 is set at electric power which falls within a range of, for example, 50 to 600 W. The internal pressure of the process chamber 201 is set at a pressure which falls within a range of, for example, 1 to 500 Pa. By using plasma, the $NH_3$ gas can be activated even when the internal pressure of the process chamber 201 is set to such a relatively low pressure range. The time, during which the active species obtained by plasma-exciting the $NH_3$ gas are supplied to the wafer 200, namely the gas supply time (injection time), is set at a time which falls within a range of, for example, 1 to 180 seconds, or 1 to 60 seconds in some embodiments. Other processing conditions are similar to the processing conditions of S3 described above.

By supplying the $NH_3$ gas to the wafer 200 under the aforementioned conditions, the Si-containing layer formed on the wafer 200 is plasma-nitrided. In this operation, Si—Cl bonds and Si—H bonds of the Si-containing layer are broken by the energy of the plasma-excited $NH_3$ gas. Cl and H, from which the bonds with Si are broken, are desorbed from the Si-containing layer. Then, Si in the Si-containing layer, which has dangling bonds due to the desorption of Cl or the like, is bonded to N contained in the $NH_3$ gas to form Si—N bonds. As this reaction proceeds, the Si-containing layer is changed (modified) into a layer containing Si and N, i.e., a silicon nitride layer (SiN layer).

In order to modify the Si-containing layer into the SiN layer, the $NH_3$ gas may be plasma-excited and supplied. This is because, even if the $NH_3$ gas is supplied under a non-plasma atmosphere, the energy needed for nitriding the Si-containing layer may be insufficient in the aforementioned temperature range and it may be difficult to sufficiently desorb Cl and H from the Si-containing layer, to sufficiently nitride the Si-containing layer, and to increase the Si—N bonds.

After the Si-containing layer is modified into the SiN layer, the valve 243b is closed to stop the supply of the $NH_3$ gas. Furthermore, the supply of the high frequency power to between the rod-shaped electrodes 269, 270 and 271 is stopped. Then, the $NH_3$ gas or reaction byproduct, which remains within the process chamber 201, is removed from the interior of the process chamber 201 under the same processing procedures and processing conditions as those of S4 (S6). S6 may also be omitted.

As a nitriding agent, i.e., a plasma-excited $NH_3$-containing gas, it may be possible to use, diazene ($N_2H_2$) gas, hydrazine ($N_2H_4$) gas, $N_3H_8$ gas, or the like, as well as the $NH_3$ gas.

As the inert gas, it may be possible to use, for example, various kinds of rare gases exemplified at S4, as well as the $N_2$ gas.

(Performing Predetermined Number of Times: S7)

A process that performs the foregoing S3, S4, S5, and S6 in this order non-simultaneously, i.e., non-synchronously, is set as one cycle, and this cycle is performed a predetermined number of times (n times), namely once or more (S7). As a result, a SiN film having a predetermined composition and a predetermined thickness can be formed on the wafer 200. The aforementioned cycle may be repeated multiple times. That is, the thickness of the SiN layer formed per one cycle may be set smaller than a desired thickness, and the aforementioned cycle may be repeated multiple times until the thickness of the SiN film formed by laminating the SiN layer becomes the desired thickness.

(Returning to Atmospheric Pressure Step: S8)

After the film-forming process described above is completed, the $N_2$ gas as an inert gas is supplied from the respective gas supply pipes 232c and 232d into the process chamber 201 and is exhausted from the exhaust pipe 231. Thus, the interior of the process chamber 201 is purged with an inert gas and the gas or the like remaining within the process chamber 201 is removed from the interior of the process chamber 201 (inert gas purge). Thereafter, the internal atmosphere of the process chamber 201 is substituted by an inert gas (inert gas substitution). The internal pressure of the process chamber 201 is returned to an atmospheric pressure (S8).

(Unloading Step: S9)

Thereafter, the seal cap 219 is moved down by the boat elevator 115 to open the lower end of the manifold 209. The processed wafers 200 supported on the boat 217 are unloaded from the lower end of the manifold 209 to the outside of the reaction tube 203 (boat unloading) (S9). After the boat unloading, the shutter 219s is moved so that the lower end opening of the manifold 209 is sealed by the shutter 219s through the O-ring 220c (shutter closing). The processed wafers 200 are unloaded to the outside of the reaction tube 203 and are subsequently discharged from the boat 217 (wafer discharging).

(3) Plasma Abnormality Determination

In the above-described film-forming process and etching process, the active species (ions and radicals) obtained by plasma-converting the reaction gas are used to promote the chemical reaction particularly on the substrate surface, thereby forming and removing a dense film. However, by repeatedly performing the processes, the plasma characteristics may change due to the deterioration of the plasma electrodes (rod-shaped electrodes in this embodiment) and the influence of the surrounding environment, and the film formation characteristics and etching characteristics may not be stable.

In this embodiment, in order to optically monitor the plasma state in the substrate processing apparatus, after the substrate processing such as the above-described film-forming process and etching process are performed a predetermined number of times as one of the above-described semiconductor device manufacturing processes using the above-described substrate processing apparatus, an empty boat 217 that does not hold a wafer is loaded into the process chamber 201, a plasma monitor 10 configured to be installed in the process chamber 201 (to be described later) is installed in the process chamber 201. Then, the reaction gas supplying step S5 of the above-described substrate processing process is performed, the gas supply holes 302 and 304 for supplying the plasma-converted gas are imaged, and a plasma emission intensity is monitored and recorded. Then, the captured image is analyzed, and the abnormal discharge and flickering of the plasma are distinguished and determined.

Figure 6:
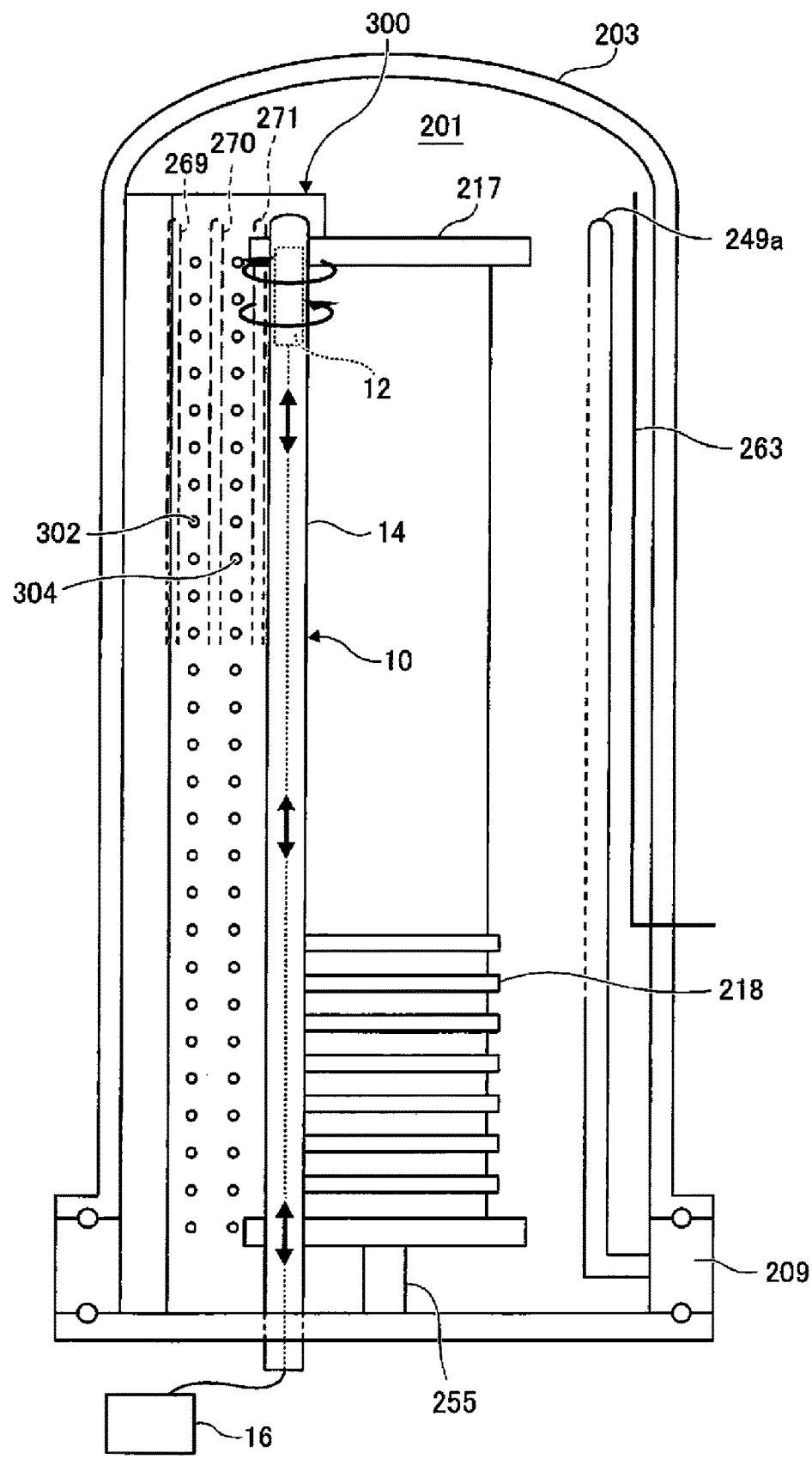
FIG. 6 is a vertical cross-sectional view of a reaction tube showing an internal configuration of a process chamber at the time of plasma abnormality determination according to an embodiment of the present disclosure.

As illustrated in FIG. 6, the plasma monitor 10 that has an elongated structure extending from the lower portion to the upper portion of the reaction tube 203 and that can be attached to and detached from the seal cap 219 or the shutter 219s is inserted into the process chamber 201.

The plasma monitor 10 is disposed at a position where the gas supply holes 302 and 304 formed on the arc-shaped wall surface of the buffer structure 300 can be imaged. Further, the plasma monitor 10 is disposed substantially parallel to the rod-shaped electrodes 269 to 271 installed in the buffer chamber 237.

The plasma monitor 10 includes an endoscope camera 12 as an imaging device that images the plasma emission intensity, and a tube-shaped protective tube 14. The protective tube 14 is formed of, for example, a quartz member. The endoscope camera 12 is configured to be movable in the vertical direction and the rotational direction within the protective tube 14.

Figure 7:
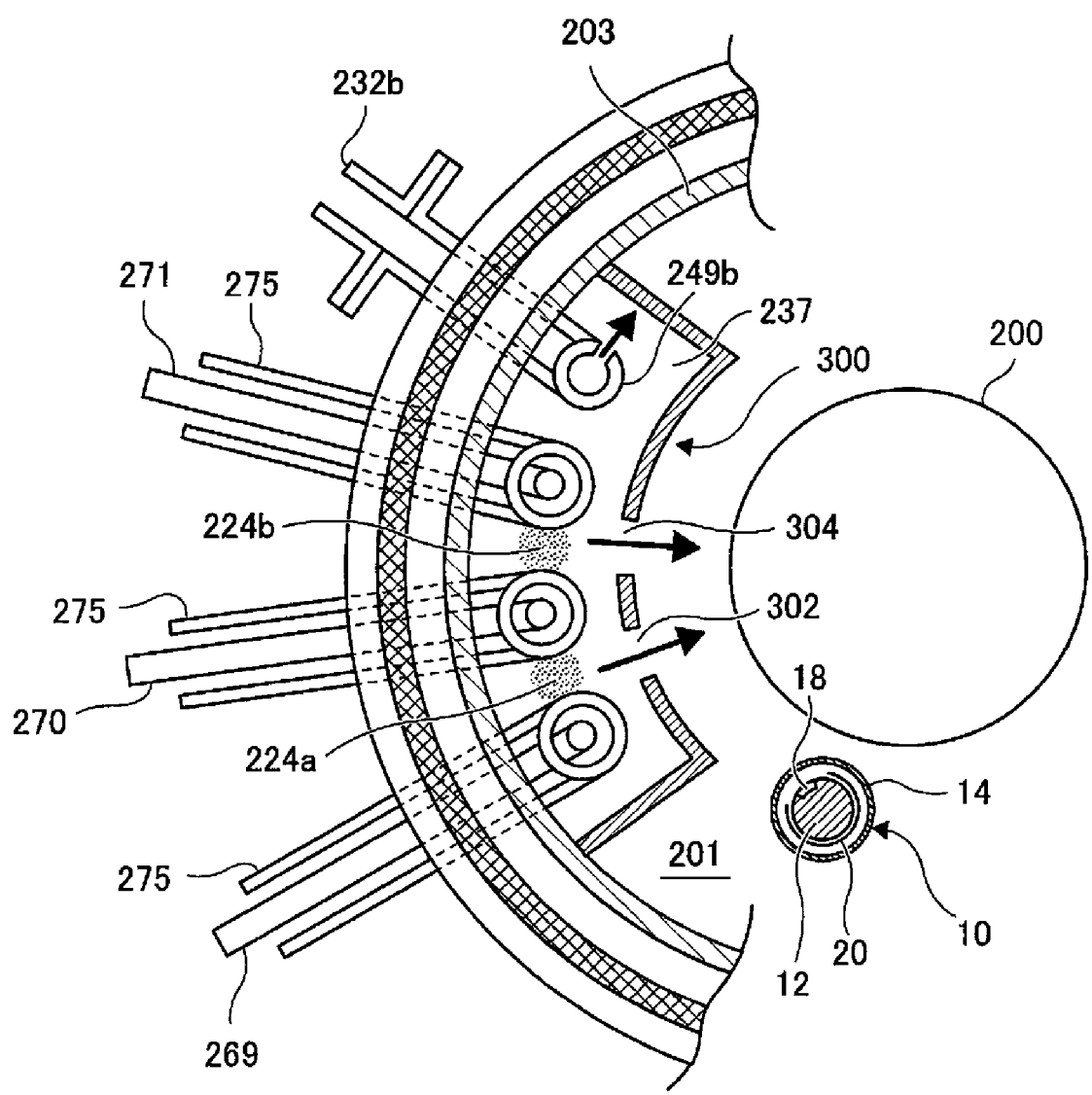
FIG. 7 is a cross-sectional view of a reaction tube showing an internal configuration of a process chamber at the time of plasma abnormality determination according to an embodiment of the present disclosure.

The endoscope camera 12 is connected to an image reception device 16 installed outside the reaction tube 203 via a cable, or the controller 121 via the image reception device 16. The endoscope camera 12 is equipped with a lens 18. Further, as illustrated in FIG. 7, a periphery of the endoscope camera 12 is covered and protected by a metal net 20 as a noise removal member such as a metal mesh or a metal foil. When the endoscope camera 12 is affected by the high frequency power supply 273 that is a plasma generation source, it receives a lot of noise. By covering the endoscope camera 12 with the metal net 20 in this manner, electromagnetic waves generated from the high frequency power supply 273 are shielded to remove electrical noise. An opening is formed in the metal net 20 so as not to obstruct the lens 18 that is at an imaging position, and the endoscope camera 12 is disposed inside the protective tube 14 with the metal net 20 covering a periphery thereof. The metal net 20 is not limited to a net shape as long as noise from the plasma can be removed, but may have any shape such as a plate shape or a cylindrical shape.

That is, the endoscope camera 12 is movable in the vertical direction and the rotational direction within the protective tube 14, and the lens 18 of the endoscope camera 12 maintains an arbitrary rotation angle with respect to the gas supply holes 302 and 304. In this state, the entire area extending from the lower portion to the upper portion of the gas supply holes 302 and 304 is moved at a constant speed in the vertical direction to take an image and acquire image data.

Figure 8:
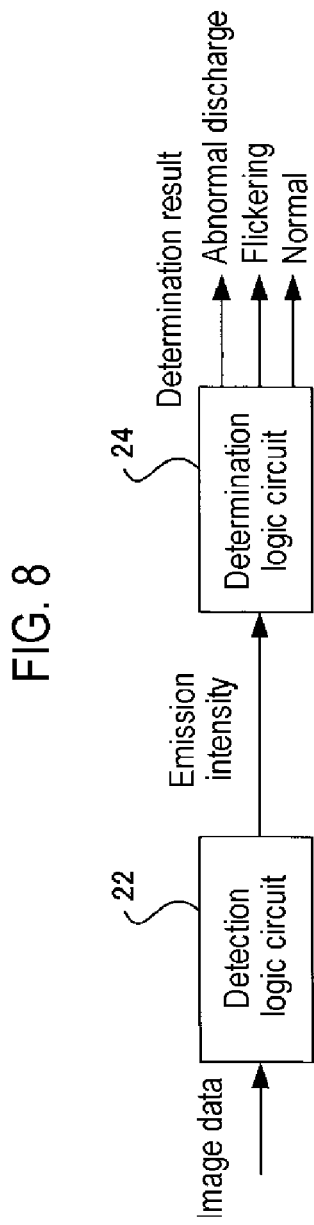
FIG. 8 is a block diagram showing a control system of a controller at the time of plasma abnormality determination according to an embodiment of the present disclosure.

FIG. 8 is a block diagram showing a control system of the controller when performing plasma abnormality determination. The controller 121 as a control means (control part) includes a detection logic circuit 22 as a detection means (detection part), and a determination logic circuit 24 as a determination means (determination part). The detection logic circuit 22 detects a plasma emission intensity based on the image data of the periphery of the gas supply holes 302 and 304 imaged by the endoscope camera 12. Based on the plasma emission intensity detected by the detection logic circuit 22, the determination logic circuit 24 determines at least one of whether abnormal plasma discharge has occurred and whether plasma flickering has occurred.

Specifically, in a logic circuit storing the plasma emission intensity in advance in the memory device 121c or the external memory device 123 based on the trimmed image data, the plasma emission intensity is read into the RAM 121b and is detected by the detection logic circuit 22, which is operated by the CPU 121a. Further, in a logic circuit storing data in advance as to whether or not the detected emission intensity is equal to or larger than a threshold value in the memory device 121c or the external memory device 123, the plasma emission intensity is read into the RAM 121b and is determined by the determination logic circuit 24, which is operated by the CPU 121a.

Then, when the emission intensity detected by the detection logic circuit 22 is equal to or larger than the threshold value, the determination logic circuit 24 determines that abnormal discharge has occurred. When the emission intensity detected by the detection logic circuit 22 is smaller than the threshold value, the determination logic circuit 24 determines whether or not there is a preset range or more between the maximum value and the minimum value of the detected emission intensity, for example, whether there is a difference of ±10% or more. Then, when it is determined that there is a difference of ±10% or more between the maximum value and the minimum value of the detected emission intensity, the determination logic circuit 24 determines that flickering has occurred. When it is determined that there is no difference of ±10% or more, the determination logic circuit 24 determines that the emission intensity is normal. Then, when it is determined that the emission intensity is normal (that there is no occurrence of the abnormal discharge and flickering), the boat 217 holding the wafers is loaded into the process chamber 201 and a substrate processing process such as the above-described film-forming process is performed.

Figure 9:
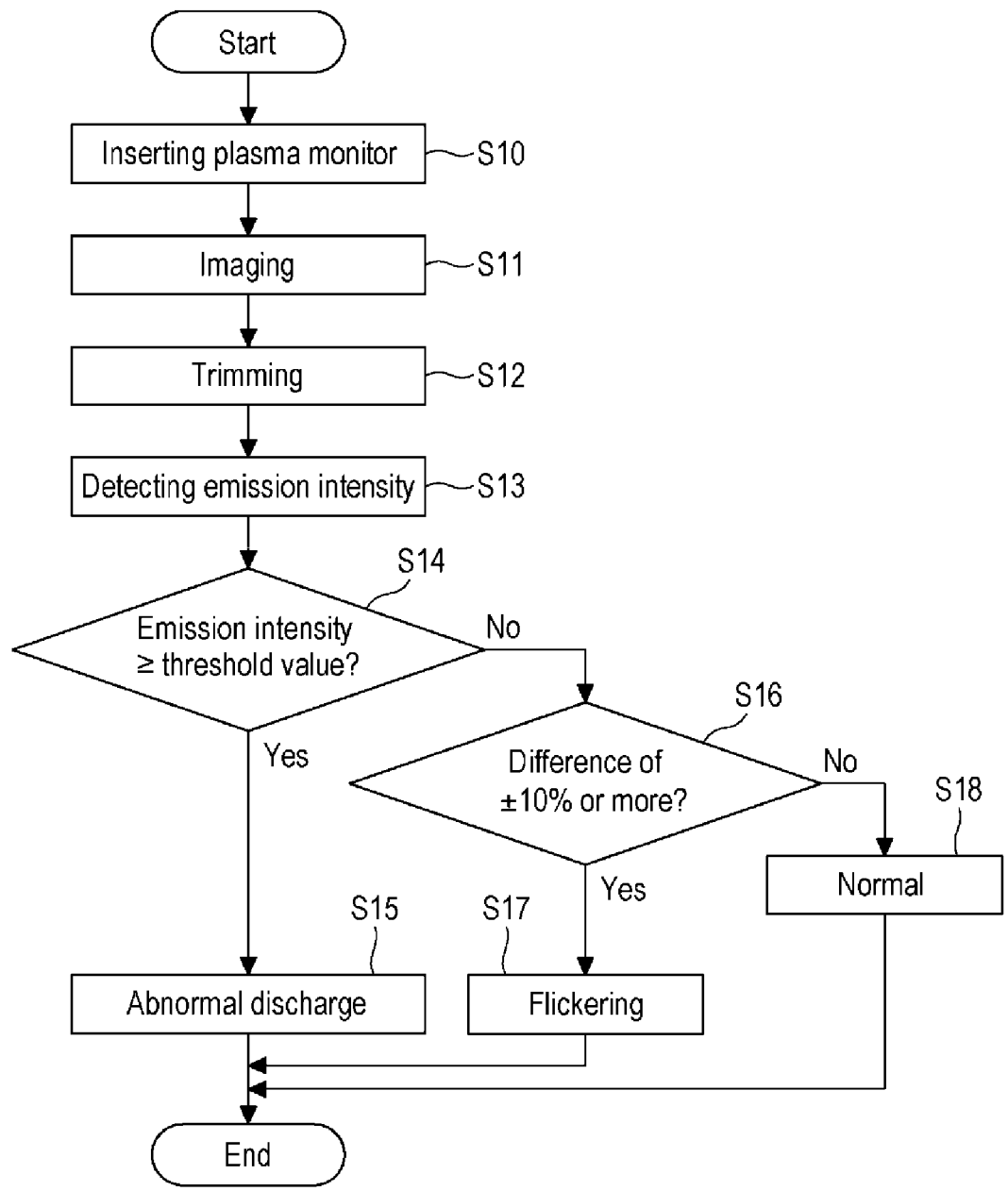
FIG. 9 is a flowchart showing abnormality determination of plasma used in the substrate processing process according to the embodiment of the present disclosure.

FIG. 9 is a flowchart showing an operation for performing the plasma abnormality determination. The operation for performing the plasma abnormality determination includes an operation to be described later and is mainly controlled by the controller 121 as the control part in the same manner as the substrate processing operation.

First, as illustrated in FIGS. 6 and 7, the plasma monitor 10 incorporating the endoscope camera 12 is inserted into the process chamber 201 (step S10).

Then, the same control as the reaction gas supplying step S5 of the above-described substrate processing process is performed to generate plasma, and the lens 18 of the endoscope camera 12 maintains an arbitrary rotation angle with respect to the gas supply holes 302 and 304. In this state, the plasma monitor 10 moves the entire area extending from the lower portion to the upper portion of the gas supply holes 302 and 304 at a constant speed in the vertical direction to take an image. A signal acquired by the endoscope camera 12 is transmitted as image data to the image reception device 16, and the plasma emission state is stored as a moving image (step S11).

Then, a region of the image data where the plasma is strongly generated is trimmed (step S12). As a result, a signal-to-noise (SN) ratio, which is a ratio between a noise component and a signal component of the emission intensity, is improved.

Then, based on the trimmed image data, the plasma emission intensity is detected by the detection logic circuit 22 (step S13), and it is determined by the determination logic circuit 24 whether or not the detected plasma emission intensity is equal to or larger than a threshold value (step S14).

When the detected plasma emission intensity is equal to or larger than the threshold value (Yes in step S14), it is determined by the determination logic circuit 24 that abnormal discharge has occurred (step S15).

Then, when it is determined that abnormal discharge has occurred, the frequency is increased, or the reaction tube 203 is replaced with a new one.

On the other hand, when the detected plasma emission intensity is smaller than the threshold (No in step S14), it is determined by the determination logic circuit 24 whether or not there is a preset range or more between the maximum value and the minimum value of the detected plasma emission intensity, for example, whether there is a difference of ±10% or more (step S16).

Then, when it is determined that there is a difference of ±10% or more between the maximum value and the minimum value of the detected plasma emission intensity (Yes in step S16), it is determined by the determination logic circuit 24 that the flickering has occurred (step S17).

Then, when it is determined that the flickering has occurred, the frequency is controlled, or the rod-shaped electrodes 269 to 271 are replaced with new ones.

When it is determined that there is no difference of ±10% or more between the maximum value and the minimum value of the detected plasma emission intensity (No in step S16), it is determined by the determination logic circuit 24 that the plasma emission intensity is normal (step S18), the boat 217 holding the wafers is loaded into the process chamber 201, and a substrate processing process such as the above-described film-forming process is performed.

(4) Examples

Next, an Example will be described in detail. In this Example, in the reaction gas supplying step S5 of the substrate processing process using the above-described substrate processing apparatus, the temperature of the process chamber 201 is set to room temperature, the internal pressure of the process chamber 201 is set to 66 Pa, and the frequency f of the high frequency power supply 273 is set to 13.56 MHz. Then, using the rod-shaped electrodes 269, 270 and 271 having a length of about 0.6 m, a diameter of about 12 mm and a DC resistance of less than 1Ω, a CCP (Capacitively Coupled Plasma) mode plasma of $NH_3$ gas is generated and supplied into the buffer chamber 237. Then, the gas supply holes 302 and 304 are imaged using the plasma monitor 10.

In this Example, the rotation angle of the endoscope camera 12 of the plasma monitor 10 is fixed toward the gas supply holes 302 and 304, and the plasma monitor 10 moves within the protective tube 14 from the lower portion to the upper portion thereof at a constant speed, and a moving image (30 frames per minute) is acquired.

Figure 10A:
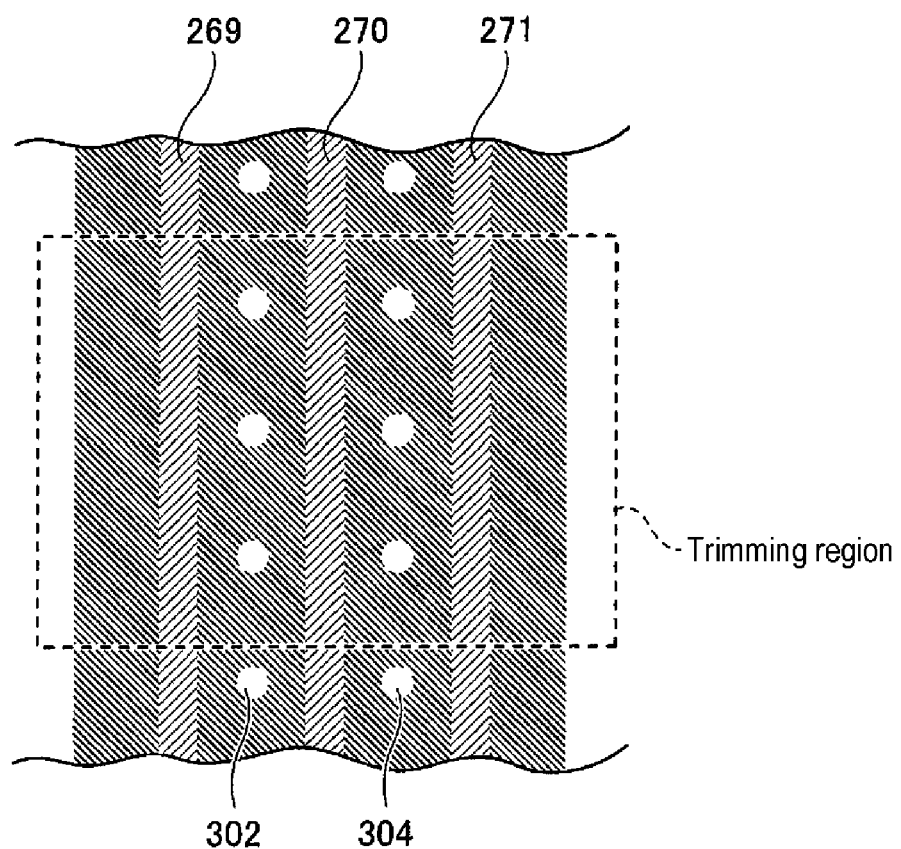
FIG. 10A is a view illustrating an example of an image obtained by imaging a periphery of a gas supply hole using a plasma monitor according to an embodiment of the present disclosure, showing a state in which plasma is normal.
Figure 10B:
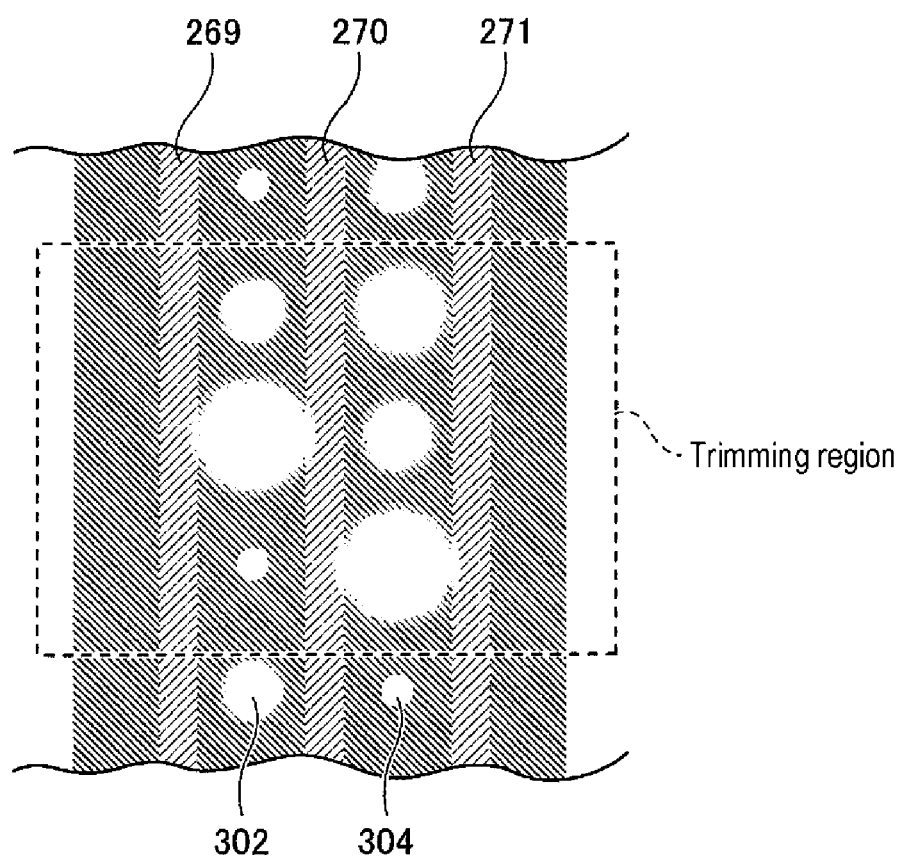
FIG. 10B is a view illustrating an example of an image obtained by imaging a periphery of a gas supply hole using a plasma monitor according to an embodiment of the present disclosure, showing a state in which plasma is abnormal.

In FIGS. 10A and 10B, a broken line frame indicates a region to be trimmed. That is, in this Example, a region of each frame image where the plasma is strongly generated is trimmed, and a determination is made with the improved S/N ratio of the plasma emission intensity.

As illustrated in FIG. 10B, when the plasma is in an abnormal state, it can be seen that strong emission is locally generated at a plurality of locations as compared with the normal state of the plasma illustrated in FIG. 10A. Such a state occurs when the shape of the gas supply holes 302 and 304 changes due to wear or deterioration of the reaction tube 203 and abnormal discharge occurs at the gas supply holes 302 and 304 whose shapes have changed.

Figure 11A:
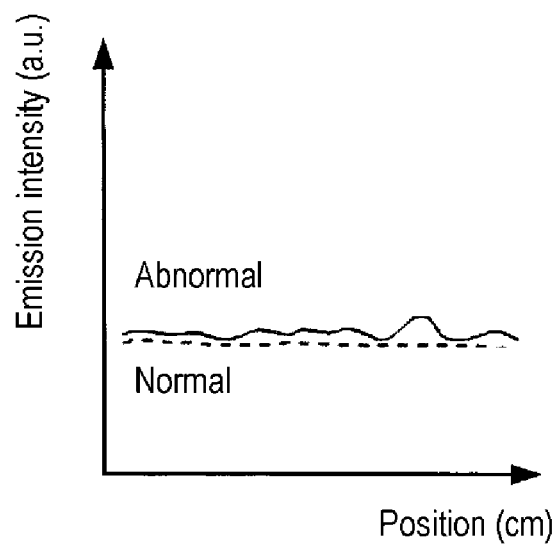
FIG. 11A is a graph showing a distribution of plasma emission intensity of gas supply holes in a vertical direction, showing an example where the emission intensity is detected without trimming a captured image.
Figure 11B:
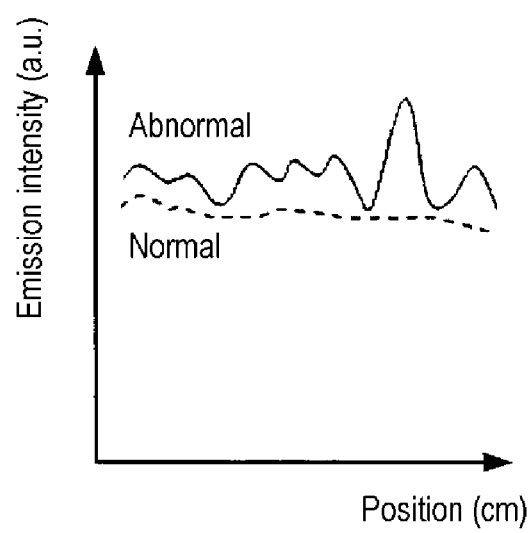
FIGS. 11B and 11C are graphs showing a distribution of plasma emission intensity of gas supply holes in a vertical direction, showing an example where the emission intensity is detected with a captured image trimmed.
Figure 11C:
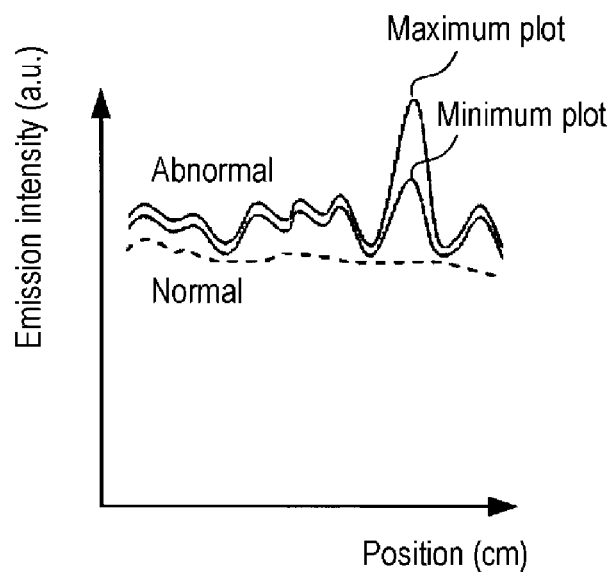

FIG. 11A is a graph showing a distribution of plasma emission intensity from the lower portion to the upper portion of the gas supply holes 302 and 304 when the plasma of FIG. 10A is normal and the plasma of FIG. 10B is abnormal, showing an example where the emission intensity is detected without trimming an acquired image. FIG. 11B is a graph showing a case where the emission intensity of a trimmed region is averaged and plotted every 10 frames. FIG. 11C is a graph showing a case where the maximum value and the minimum value of the emission intensity of the trimmed region are plotted every 10 frames.

That is, as illustrated in FIG. 11A, when the acquired image is not trimmed, it has a noise level distribution, and it is difficult to determine whether or not plasma abnormality has occurred. On the other hand, as illustrated in FIGS. 11B and 11C, when the acquired image is trimmed, the S/N ratio is improved, and, when the plasma is abnormal, the plasma emission intensity is sharpened.

Then, as illustrated in FIGS. 11B and 11C, when the plasma emission intensity is equal to or larger than the threshold value, it is determined that a peak position thereof is an abnormal discharge occurrence point. Further, as illustrated in FIG. 11C, when the maximum value and the minimum value of the plasma emission intensity are plotted for each frame, it is determined that the flickering has occurred when a difference between the maximum plot and the minimum plot is, for example, ±10% or more.

That is, as illustrated in FIG. 11C, a portion where a large difference appears in a plot curve of the maximum value and the minimum value means that there is the flickering.

The above-described controller 121 also functions as a plasma control device that controls plasma generation and plasma abnormality determination. That is, the controller 121 can monitor the plasma emission intensity imaged by the endoscope camera 12 built in the plasma monitor 10 and can determine whether the plasma is normal or abnormal even by computer algorithm processing.

Then, when it can be determined that the plasma is normal, since the plasma emission intensity is quantified, it can be managed as an index representing an amount of active species generated, and the amount of active species generated, in other words, plasma characteristics, can be maintained by adjusting the power and frequency of the high frequency power supply.

(5) Effects According to the Present Embodiment

According to the present embodiment, one or more effects set forth below may be achieved.

(a) According to the present embodiment, it is possible to determine a plasma abnormality with high accuracy.

(b) According to the present embodiment, it is possible to distinguish between abnormal plasma discharge and plasma flickering, and it is possible to take measures against each of the abnormal plasma discharge and the flickering.

(c) According to the present embodiment, even when an electrode and its surrounding environment are changed, by adjusting a power value and a frequency value of the high frequency power supply based on the image data, it is possible to maintain the plasma characteristics and stabilize the film formation characteristics and etching characteristics.

(d) According to the present embodiment, by maintaining the plasma characteristics, it is possible to stabilize the film formation characteristics and etching characteristics and improve the productivity and stability for wafer processing.

The embodiments of the present disclosure have been specifically described above. However, the present disclosure is not limited to the above-described embodiments, and various modifications can be made without departing from the spirit and scope of the present disclosure.

For example, in the above-described embodiments, the arrangement position (insertion position) of the plasma monitor 10 is as shown in FIGS. 6 and 7. However, the present disclosure is not limited thereto. If such conditions where the entire object can be imaged, there is a sufficient space, the endoscope camera 12 is focused on the object, and the plasma monitor 10 does not contact other members such as the reaction tube 203 and the boat 217 are satisfied, the plasma monitor 10 may be disposed anywhere.

In the above-described embodiments, the configuration in which an empty boat 217 is loaded into the process chamber 201 and the plasma abnormality is determined after the above-described film-forming process and etching process are performed a predetermined number of times has been described. However, the present disclosure is not limited to such a configuration. For example, it may be possible to perform the plasma abnormality determination in a state where the boat holding the wafers is loaded, or to perform the plasma abnormality determination at the time of setting up the apparatus.

In the above-described embodiments, the case where one buffer structure is provided has been described. However, the present disclosure is not limited to such a case. The present disclosure may be applied to a case where two or more buffer structures are provided. When it is determined that the flickering has occurred in the two or more buffer structures, a trigger signal can be synchronized between two high frequency power supplies for improvement.

In the above-described embodiments, the example in which the reaction gas is supplied after the precursor is supplied has been described. However, the present disclosure is not limited to such an example. The supply order of the precursor and the reaction gas may be reversed. That is, the precursor may be supplied after the reaction gas is supplied. By changing the supply order, a film quality and a composition ratio of the formed film may be changed.

In the above-described embodiments, the example in which the plasma abnormality determination is performed after the film-forming process is performed a predetermined number of times has been described. However, the present disclosure is not limited to such an example. The present disclosure may also be applied to other substrate processing using plasma, such as performing plasma abnormality determination after performing an etching process a predetermined number of times. Thus, the plasma characteristics can be maintained and the etching characteristics can be stabilized.

Recipes used in the film-forming process and the etching process may be prepared individually according to the processing contents and may be stored in the memory device 121c via a telecommunication line or the external memory device 123. Moreover, at the beginning of various types of processes, the CPU 121a may properly select an appropriate recipe from the recipes stored in the memory device 121c according to the contents of the processing. Thus, it is possible for a single substrate processing apparatus to form thin films of various kinds, composition ratios, qualities, and thicknesses for general purpose and with enhanced reproducibility. In addition, it is possible to reduce an operator's burden and to quickly start the various processes while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the substrate processing apparatus may be directly changed by operating the input/output device 122 of the substrate processing apparatus.

In the above-described embodiments, the substrate processing apparatus has been described. However, the present disclosure can be applied to all semiconductor manufacturing apparatuses.

According to the present disclosure, it is possible to provide a technique capable of determining plasma abnormality.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of determining a plasma abnormality, comprising:
imaging a plurality of gas supply holes formed in a vertical direction and configured to supply a plasma-converted gas into a process chamber by using an imaging device disposed in the process chamber;
detecting a plasma emission intensity based on an image of the imaged gas supply hole; and determining at least one of whether abnormal plasma discharge has occurred and whether plasma flickering has occurred based on the detected plasma emission intensity.

2. The method of claim 1, wherein, when the detected plasma emission intensity is equal to or larger than a threshold value, it is determined that the abnormal plasma discharge has occurred.

3. The method of claim 1, wherein, when the detected plasma emission intensity is smaller than a threshold value and there is a difference of a predetermined range or more between a maximum value and a minimum value of the detected plasma emission intensity, it is determined that the plasma flickering has occurred.

4. A method of manufacturing a semiconductor device, comprising:
supplying a plasma-converted gas into a process chamber in which a substrate is processed, via a plurality of gas supply holes formed in a vertical direction on a wall surface of a buffer structure forming a buffer chamber configured to generate a plasma;
processing the substrate by supplying the plasma-converted gas to the substrate;
imaging the plurality of gas supply holes by using an imaging device disposed in the process chamber;
detecting a plasma emission intensity based on an image of the imaged gas supply holes; and
determining at least one of whether abnormal plasma discharge has occurred and whether plasma flickering has occurred based on the detected plasma emission intensity.

5. The method of claim 4, wherein the act of imaging the plurality of gas supply holes is performed after the act of supplying the plasma-converted gas and the act of processing the substrate are performed a predetermined number of times.

6. The method of claim 4, wherein, when it is determined that the abnormal plasma discharge and the plasma flickering have not occurred in the act of determining at least one of whether the abnormal plasma discharge has occurred and whether the plasma flickering has occurred, the substrate is loaded into the process chamber and the act of processing the substrate is performed.

7. The method of claim 4, wherein, when the detected plasma emission intensity is equal to or larger than a threshold value, it is determined that the abnormal plasma discharge has occurred in the act of determining at least one of whether the abnormal plasma discharge has occurred and whether the plasma flickering has occurred.

8. The method of claim 4, wherein, when the detected plasma emission intensity is smaller than a threshold value and there is a difference of a predetermined range or more between a maximum value and a minimum value of the detected plasma emission intensity, it is determined that the plasma flickering has occurred in the act of determining at least one of whether the abnormal plasma discharge has occurred and whether the plasma flickering has occurred.

9. The method of claim 4, wherein, when the detected plasma emission intensity is smaller than a threshold value and there is no difference of a predetermined range or more between a maximum value and a minimum value of the detected plasma emission intensity, it is determined that the abnormal plasma discharge and the plasma flickering have not occurred in the act of determining at least one of whether the abnormal plasma discharge has occurred and whether the plasma flickering has occurred.

10. The method of claim 4, further comprising trimming a region of the image where the plasma is strongly generated.

11. The method of claim 4, further comprising plasma-converting a gas by using at least two electrodes connected to a power supply and a grounded electrode interposed between the at least two electrodes.

12. A method of manufacturing a semiconductor device, comprising:
supplying a plasma-converted gas into a process chamber in which a substrate is processed, via a gas supply hole formed on a wall surface of a buffer structure forming a buffer chamber configured to generate a plasma;
processing the substrate by supplying the plasma-converted gas to the substrate;
imaging the gas supply hole by using an imaging device disposed in the process chamber;
detecting a plasma emission intensity based on an image of the imaged gas supply hole; and
determining at least one of whether abnormal plasma discharge has occurred and whether plasma flickering has occurred based on the detected plasma emission intensity,
wherein, when it is determined that the abnormal plasma discharge and the plasma flickering have not occurred in the act of determining at least one of whether the abnormal plasma discharge has occurred and whether the plasma flickering has occurred, the substrate is loaded into the process chamber and the act of processing the substrate is performed.

13. A substrate processing apparatus comprising:
a process chamber in which at least one substrate is processed;
a buffer chamber configured to generate a plasma;
a gas supply system configured to supply a gas into the buffer chamber;
a buffer structure forming the buffer chamber and including a plurality of gas supply holes that are formed in a vertical direction in the buffer structure and configured to supply a plasma-converted gas, which is supplied and plasma-converted in the buffer chamber, into the process chamber;
an imaging device disposed in the process chamber and being configured to image the plurality of gas supply holes; and
a controller configured to detect a plasma emission intensity based on an image of the plurality of gas supply holes imaged by the imaging device and determine at least one of whether abnormal plasma discharge has occurred and whether plasma flickering has occurred based on the detected plasma emission intensity.

14. The substrate processing apparatus of claim 13, wherein the at least one substrate includes a plurality of substrates, and wherein the substrate processing apparatus further comprises a substrate support configured to support the plurality of substrates in the vertical direction in multiple stages.

15. The substrate processing apparatus of claim 13, wherein a periphery of the imaging device is covered with a noise removal member.

16. The substrate processing apparatus of claim 13, wherein, when the detected plasma emission intensity is equal to or larger than a threshold value, the controller is further configured to determine that the abnormal plasma discharge has occurred.

17. The substrate processing apparatus of claim 13, wherein, when the detected plasma emission intensity is smaller than a threshold value and there is a difference of a predetermined range or more between a maximum value and a minimum value of the detected plasma emission intensity, the controller is further configured to determine that the plasma flickering has occurred.

18. The substrate processing apparatus of claim 13, wherein at least two first electrodes connected to a power supply and a grounded second electrode interposed between the at least two first electrodes are installed in the buffer structure.

19. The substrate processing apparatus of claim 18, wherein the at least two first electrodes and the grounded second electrode are installed in the vertical direction.

* * * * *